United States Patent
You

(10) Patent No.: US 7,586,122 B2
(45) Date of Patent: Sep. 8, 2009

(54) THIN FILM TRANSISTOR SUBSTRATE AND MANUFACTURING METHOD THEREOF

(75) Inventor: Chun Gi You, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/481,117

(22) Filed: Jul. 5, 2006

(65) Prior Publication Data

US 2007/0002201 A1    Jan. 4, 2007

(30) Foreign Application Priority Data

Jul. 4, 2005    (KR) .................... 10-2005-0059658

(51) Int. Cl.
H01L 29/04     (2006.01)
H01L 29/10     (2006.01)
H01L 31/20     (2006.01)
H01L 31/036    (2006.01)
H01L 31/0376   (2006.01)

(52) U.S. Cl. .............. 257/59; 257/66; 257/72; 257/E27.063; 257/E27.064; 257/E27.111; 438/151; 438/155; 349/39; 349/43; 349/149

(58) Field of Classification Search ............. 257/57, 257/66, 72, 350, E27.063, E27.064, E27.111; 349/38, 39, 43, 113, 115, 149; 438/151, 438/155

See application file for complete search history.

(56) References Cited

U.S. PATENT DOCUMENTS 6,078,365 A * 6/2000 Ueda et al. .............. 349/43
6,158,630 A * 12/2000 Mayerle et al. .......... 222/413
6,893,908 B2 * 5/2005 You et al. ................ 438/155
2002/0127753 A1 * 9/2002 Jang ....................... 438/29
2002/0135709 A1 * 9/2002 Sung Chae et al. ........ 349/43
2003/0086046 A1 * 5/2003 You ......................... 349/149
2003/0151095 A1 * 8/2003 You et al. ................ 257/350
2004/0141116 A1 * 7/2004 You ......................... 349/113
2004/0261715 A1 * 12/2004 Yoo ...................... 118/723 E

FOREIGN PATENT DOCUMENTS

| JP | 9101541 | 4/1997 |
| JP | 10161149 | 6/1998 |
| JP | 200570788 | 3/2005 |
| KR | 1020050022265 | 3/2005 |

* cited by examiner

*Primary Examiner*—Zandra Smith
*Assistant Examiner*—Telly D Green
(74) *Attorney, Agent, or Firm*—Cantor Colburn LLP

(57) ABSTRACT

A thin film transistor substrate having improved display quality includes a gate line, a data line intersecting the gate line and providing a pixel region adjacent the gate line and the data line, a data pattern formed on substantially a same plane and of substantially a same metal as the data line, a thin film transistor connected to the gate line and the data line, a pixel electrode connected to the thin film transistor, an organic protective layer formed under the pixel electrode and protecting the thin film transistor, and an inorganic protective layer formed between the data pattern and the organic protective layer, the inorganic protective layer formed on the data pattern with a pattern similar to the data pattern. A manufacturing method of the above-described thin film transistor substrate is further provided.

19 Claims, 16 Drawing Sheets

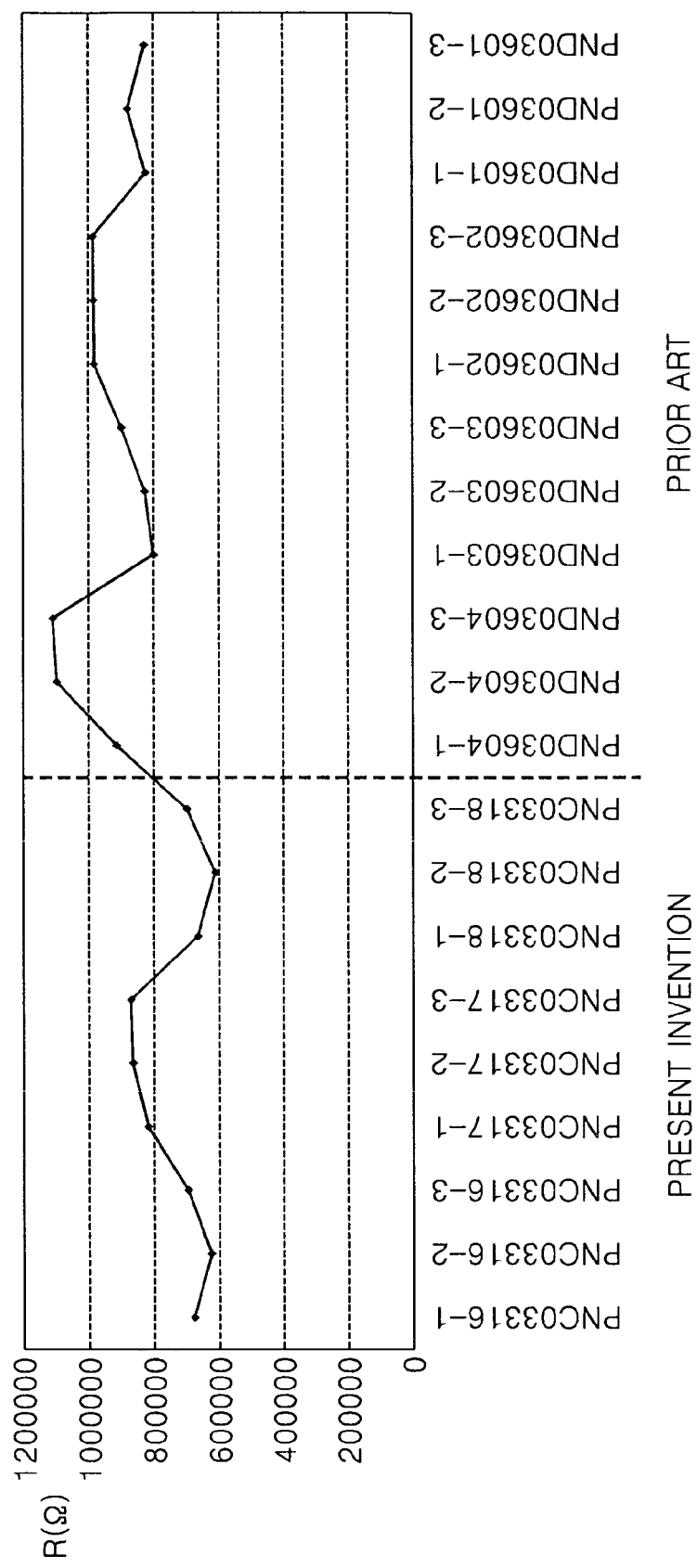

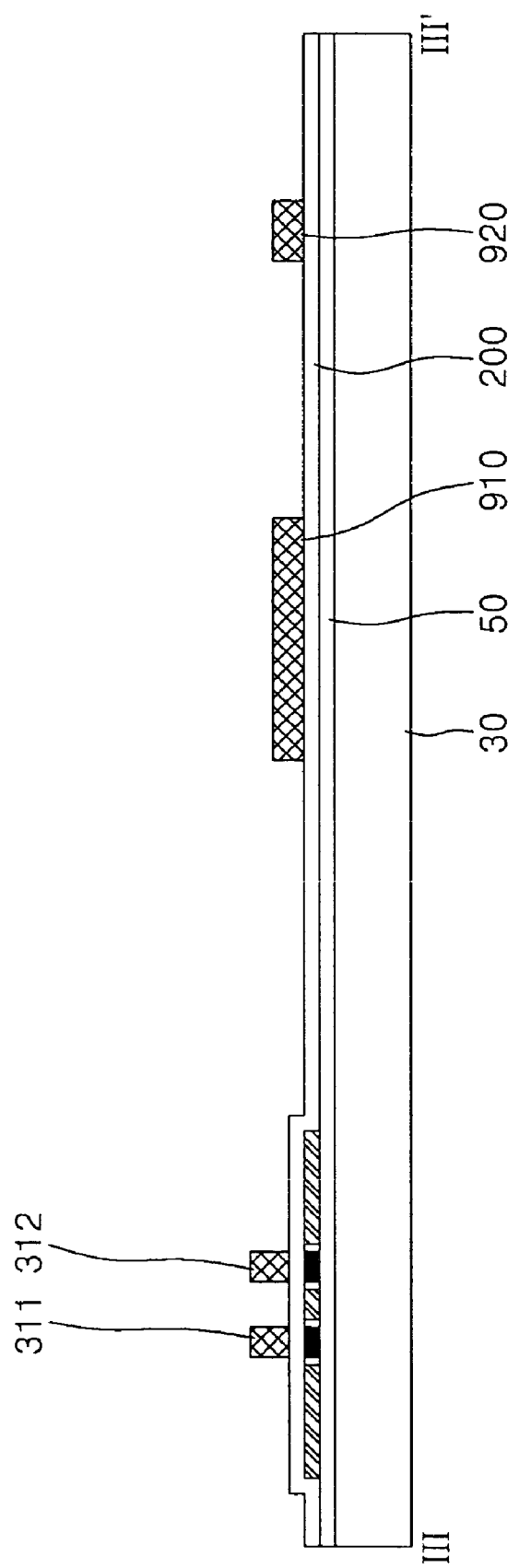

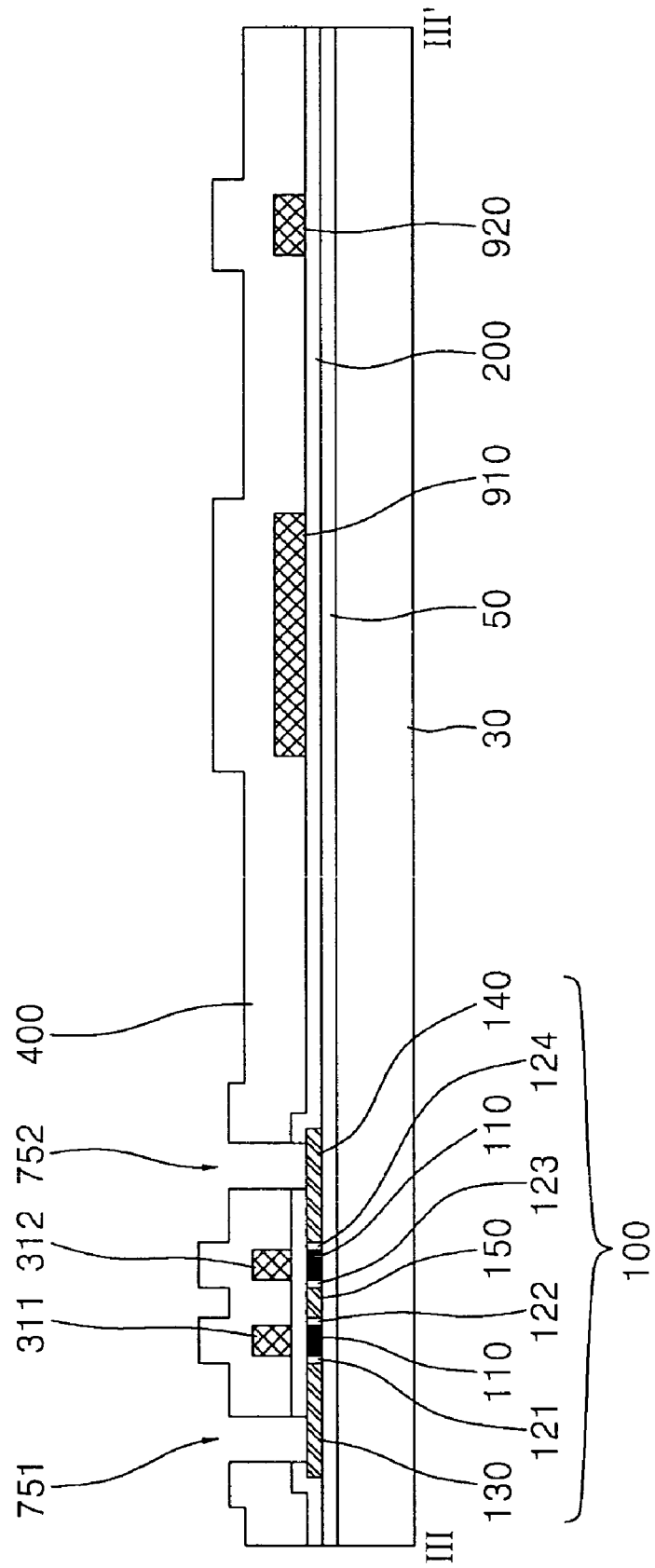

THIN FILM TRANSISTOR SUBSTRATE AND MANUFACTURING METHOD THEREOF

This application claims priority to Korean Patent Application No. 2005-59658, filed on Jul. 4, 2005 and all the benefits accruing therefrom under 35 U.S.C. §119, and the contents of which in its entirety are herein incorporated by reference.

BACKGROUND OF THE INVENTION

1. Field of the Invention

The present invention relates to a thin film transistor ("TFT") substrate and manufacturing method thereof, and more particularly, to a TFT substrate having improved display quality and a manufacturing method thereof.

2. Description of the Related Art

Generally, a TFT substrate is used as a substrate for independently driving each pixel in a liquid crystal display ("LCD"), an organic light emitting diode ("OLED"), etc.

The TFT substrate includes gate lines for transferring a gate signal, data lines for transferring a data signal, TFTs connected to the gate and data lines, and pixel electrodes connected to the TFTs. The gate lines and the data lines generally extend perpendicularly to each other, and a pixel is formed between each pair of adjacent gate lines and pair of adjacent data lines.

The TFT substrate further includes several insulating layers for insulating signal wirings and electrodes. In particular, an organic protective layer is used to insulate a data pattern including the source and drain electrodes of a TFT and a data line from a pixel electrode. An inorganic protective layer may be additionally formed between the data pattern and the organic protective layer.

Metal, used to form the data pattern, may have stains if it is directly exposed to chemicals such as an etchant or developer. Moreover, such metal forms a metal oxide layer by reacting easily to deionized ("DI") water or moisture in the air.

The metal oxide layer weakens adhesion of the organic protective layer to the data pattern, causing the organic protective layer to be unfastened relative to the data pattern. Moreover, the metal oxide layer debases adhesion of a photoresist to the data pattern and thus the data pattern becomes disconnected. Also, the metal oxide layer makes a data line and a source electrode be shorted, giving rise to pixel defects. Furthermore, since it is impossible to form a minute pattern due to the metal oxide layer, it is difficult to achieve system-on-glass ("SOG").

As described above, in the TFT substrate having a structure where the data pattern is directly exposed to various chemicals or where the data pattern is in direct contact with the organic protective layer, there occurs various stains and defects, and the display quality of a display device using the TFT substrate deteriorates.

BRIEF SUMMARY OF THE INVENTION

It is therefore an object of the present invention to provide a TFT substrate having improved display quality and a manufacturing method thereof.

In exemplary embodiments of the present invention, there is provided a TFT substrate, including a gate line, a data line intersecting the gate line and providing a pixel region adjacent the gate line and the data line, a data pattern formed on substantially a same plane and of substantially a same metal as the data line, a TFT connected to the gate line and the data line, a pixel electrode connected to the TFT, an organic protective layer formed under the pixel electrode and protecting the TFT, and an inorganic protective layer formed between the data pattern and the organic protective layer, the inorganic protective layer formed on the data pattern with a pattern similar to the data pattern.

Preferably, the pattern of the inorganic protective layer has a narrower width than a width of the data pattern. The inorganic protectively layer may also have a perimeter less than a perimeter of the data pattern, and a periphery of the inorganic protective layer may lie within a projected periphery of the data pattern.

Preferably, the TFT substrate further includes an interlayer insulating layer formed under the data pattern, wherein a surface of the interlayer insulating layer in direct contact with the data pattern is less than a width of the data pattern.

Preferably, the TFT includes a gate electrode connected to the gate line, a source electrode connected to the data line, a drain electrode connected to the pixel electrode, and an active layer forming a channel between the source electrode and the drain electrode.

Preferably, the TFT substrate further includes a storage electrode overlapped by the pixel electrode, a storage capacitor formed by and between the storage electrode and the pixel electrode, wherein at least one of the organic protective layer, the inorganic protective layer, and the interlayer insulating layer is disposed between the storage electrode and the pixel electrode.

Preferably, the TFT substrate further includes a contact hole penetrating the organic protective layer and the inorganic protective layer, wherein the pixel electrode is connected to the drain electrode via the contact hole.

Preferably, the inorganic protective layer is formed only on the data line, the source electrode and the drain electrode.

In other exemplary embodiments of the present invention, there is provided a method of manufacturing a TFT substrate, including forming an active layer on an insulating substrate, forming a gate insulating layer, forming a gate pattern including a gate line and a gate electrode, depositing a data metal layer, forming an inorganic protective layer on the data metal layer, forming a data pattern including a data line, a source electrode and a drain electrode by patterning the data metal layer and the inorganic protective layer, forming an organic protective layer on the data pattern, and forming a transparent conductive pattern including a pixel electrode on the organic protective layer.

Preferably, forming the inorganic protective layer occurs without exposing the data metal layer to air. Also, forming the inorganic protective layer may occur without exposing the data metal layer to moisture.

Preferably, depositing a data metal layer and forming an inorganic protective layer are performed within the same chamber.

Preferably, forming a data pattern includes forming a photoresist on the inorganic protective layer, forming a patterning mask by patterning the photoresist, etching the data metal layer and the inorganic protective layer by using the patterning mask as a mask, and removing the patterning mask.

Preferably, etching the data metal layer and the inorganic protective layer includes first dry etching the data metal layer and the inorganic protective layer, and second dry etching the data metal layer.

Preferably, the first dry etching is performed by using $SF_6$ and $O_2$, and the second dry etching is performed by using $Cl_2$ and $O_2$.

Preferably, the inorganic protective layer has a width less than a width of the data pattern when the data pattern is formed. The inorganic protective layer may thus have a perimeter less than a perimeter of the data pattern, and a periphery of the inorganic protective layer may lie within a projected periphery of the data pattern when the data pattern is formed.

Preferably, the method of manufacturing the TFT substrate further includes forming an interlayer insulating layer covering the gate pattern, and forming a surface of the interlayer insulating layer in direct contact with the data pattern to have a width less than a width of the data pattern.

Preferably, the method of manufacturing the TFT substrate further includes forming a contact hole penetrating the organic protective layer and the inorganic protective layer.

In accordance with other exemplary embodiments, a thin film transistor substrate includes a data pattern and an inorganic protective layer overlying the data pattern, wherein a perimeter of the inorganic protective layer is less than or equal to a perimeter of the data pattern.

A periphery of the inorganic protective layer preferably lies within a projected periphery of the data pattern.

The thin film transistor substrate may further include an organic protective layer overlying the inorganic protective layer, and a pixel electrode formed on the organic protective layer, wherein the pixel electrode contacts a portion of the data pattern through a contact hole formed through the organic protective layer and the inorganic protective layer.

BRIEF DESCRIPTION OF THE DRAWINGS

The above and other features and advantages of the present invention will become more apparent from the following detailed description when taken in conjunction with the accompanying drawings in which:

FIG. 9 is a graph illustrating measured values of a contact resistance of an exemplary embodiment of a TFT substrate according to the present invention as compared with a TFT substrate having conventional normal values;

FIGS. 10A to 10F are cross-sectional views illustrating processes of manufacturing an exemplary embodiment of a TFT substrate according to the present invention; and

DETAILED DESCRIPTION OF THE INVENTION

Figure 1:
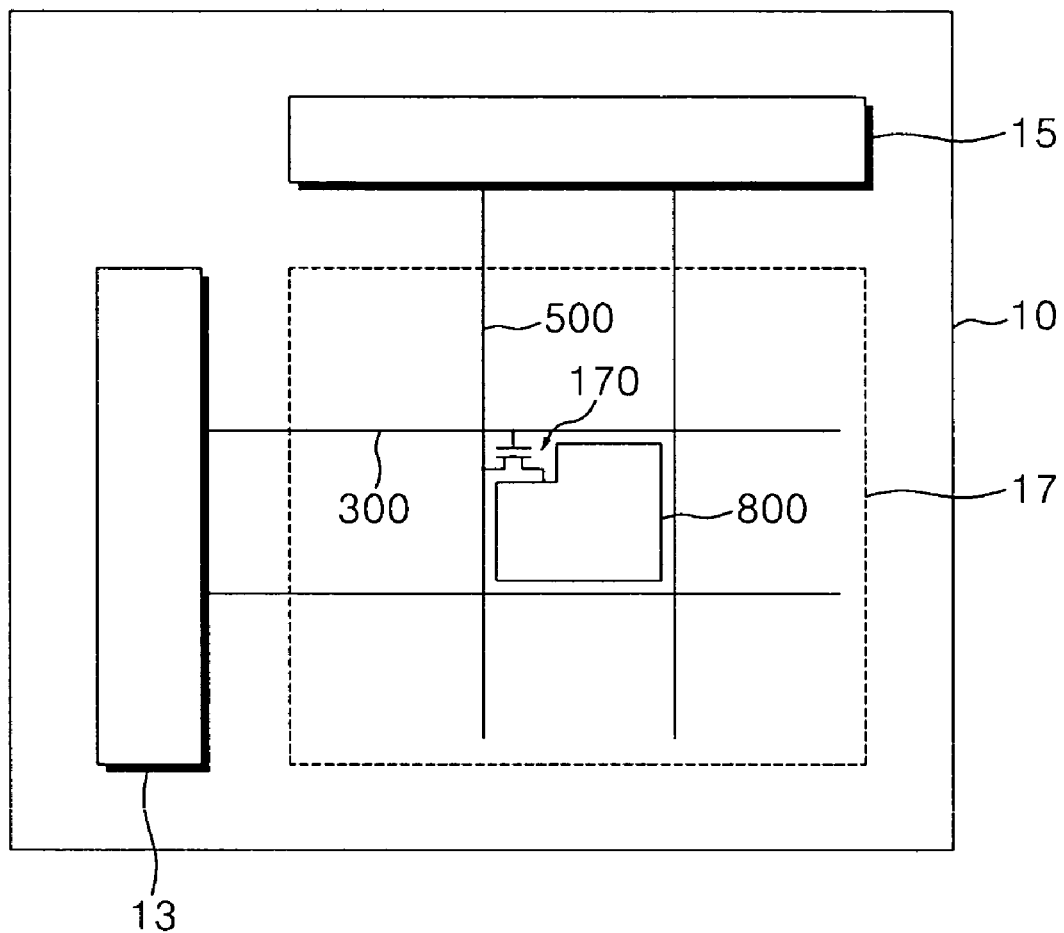
FIG. 1 is a layout view illustrating an exemplary embodiment of a TFT substrate according to the present invention.

Preferred embodiments of the present invention will be described herein below with reference to the attached drawings. In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present. Although a channel of a TFT applied to the present invention may be formed of a polysilicon, amorphous silicon ("a-Si"), or other similar material, only a polysilicon TFT and a polysilicon TFT substrate of which channel is formed of polysilicon will be described herein.

Figure 2:
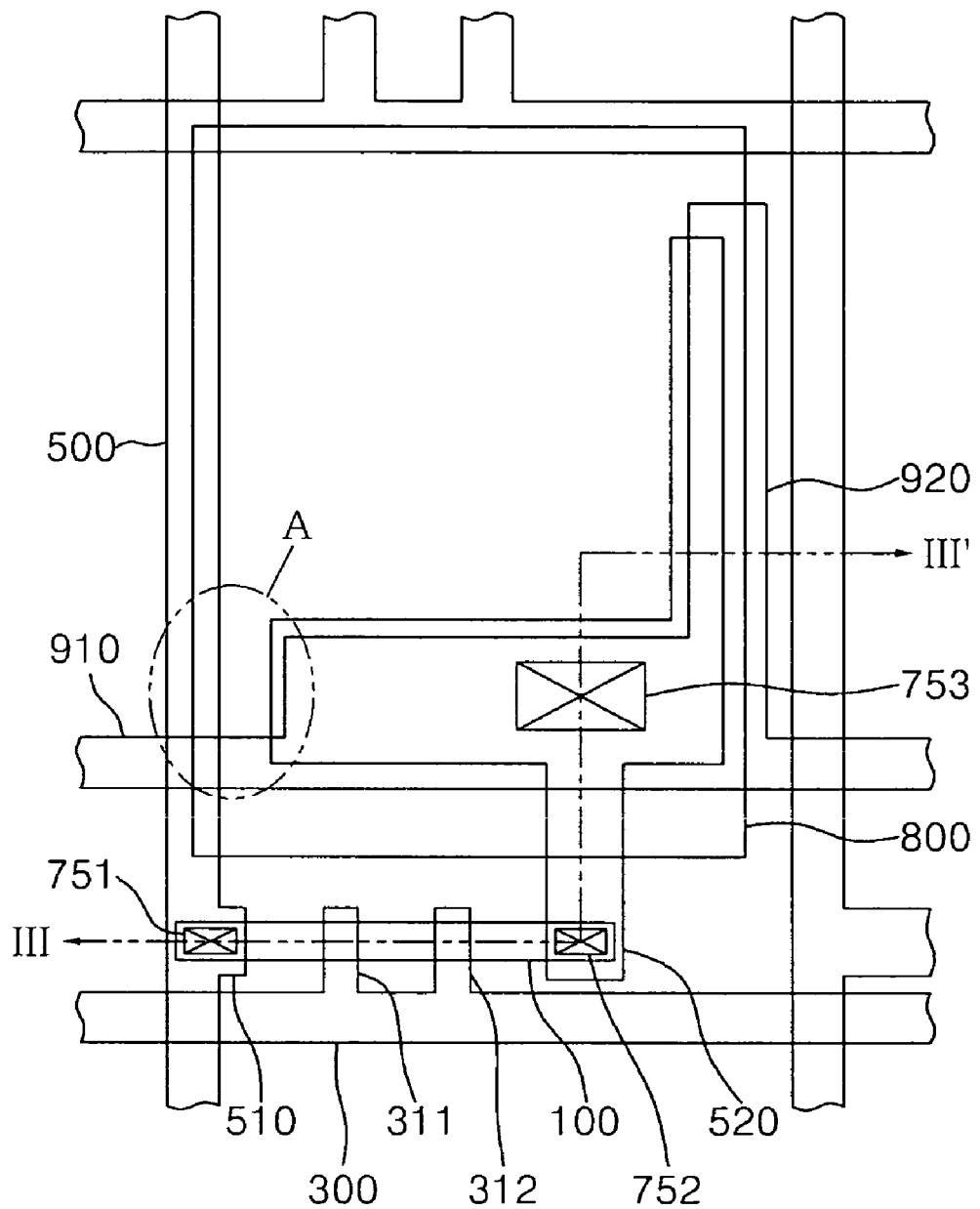
FIG. 2 is a layout view illustrating one exemplary pixel region shown in FIG. 1.
Figure 3:
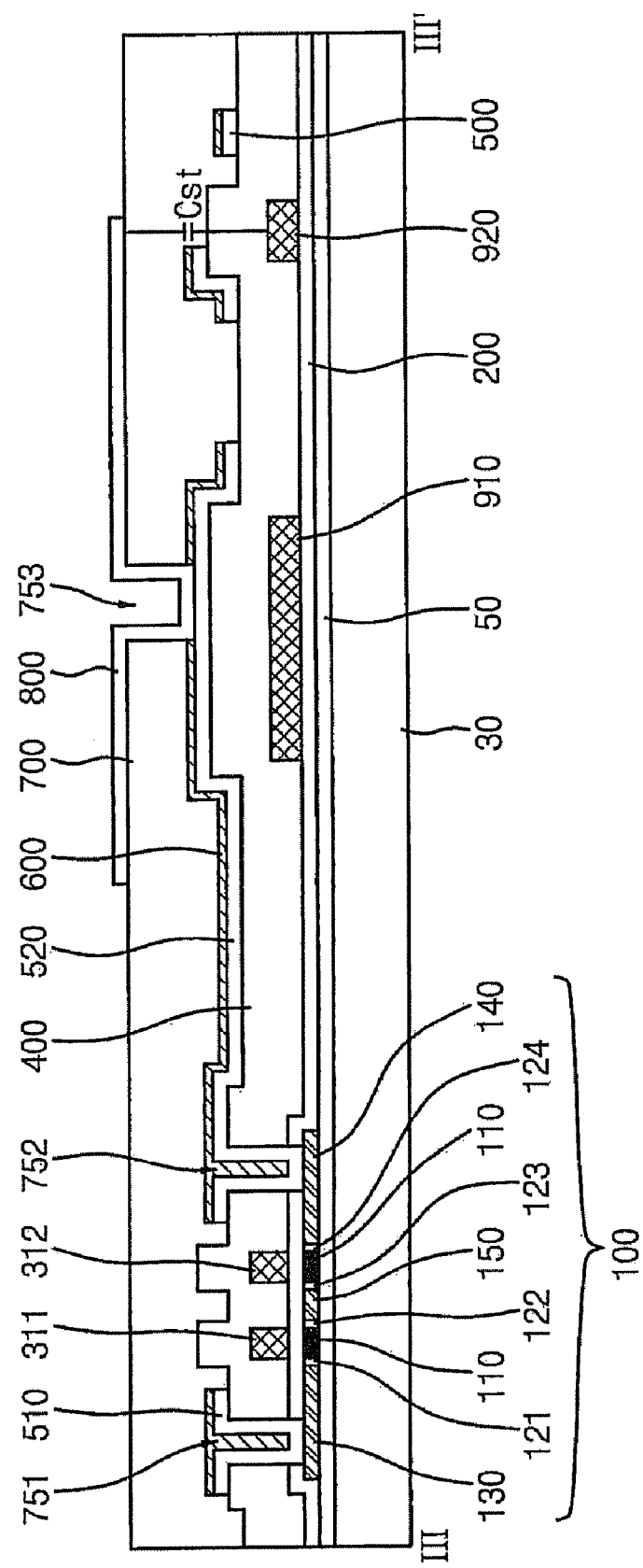
FIG. 3 is a cross-sectional view taken along line III-III' in FIG. 2.
Figure 4:
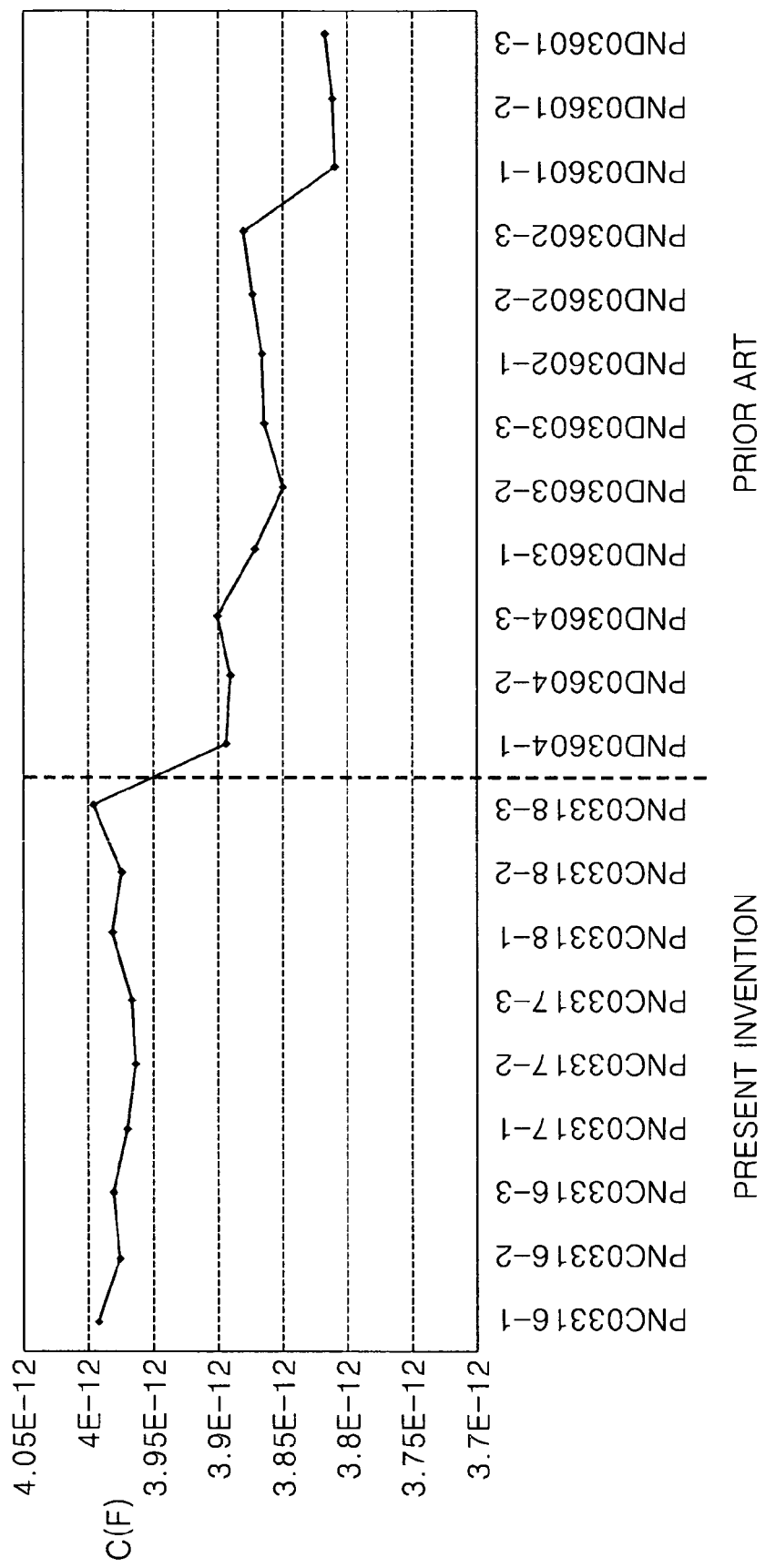
FIG. 4 is a graph illustrating charge characteristics of an organic protective layer in an exemplary embodiment of a TFT substrate according to the present invention as compared with a TFT substrate having a conventional normal value.

FIG. 1 is layout view illustrating an exemplary embodiment of a TFT substrate according to the present invention; FIG. 2 is a layout view illustrating one exemplary pixel region shown in FIG. 1; FIG. 3 is a cross-sectional view taken along line III-III' in FIG. 2; and FIG. 4 is a graph illustrating charge characteristics of an organic protective layer in an exemplary embodiments of a TFT substrate according to the present invention as compared with a TFT substrate having a conventional normal value.

Referring to FIG. 1, a TFT substrate 10 includes an effective display region 17 having pixel regions defined by intersections of a plurality of gate lines 300 and a plurality of data lines 500, a data driving circuit 15 for driving the data lines 500 of the effective display region 17, and a gate driving circuit 13 for driving the gate lines 300 of the effective display region 17. The gate lines 300 extend in a direction substantially perpendicular to the data lines 500, and are insulated from each other. While only two of each of the gate lines 300 and the data lines 500 are illustrated in FIG. 1 for clarity, it should be understood that more gate lines 300 and data lines 500 may be utilized within the TFT substrate 10. The effective display region 17 includes a TFT 170 formed in each pixel region and a pixel electrode 800. The TFT 170 charges a data signal of the data line 500 to the pixel electrode 800 in response to a gate signal of the gate line 300. If the TFT substrate 10 is used for an LCD, the pixel electrode 800 generates a potential difference together with a common electrode of a color filter substrate that faces the TFT substrate 10. In such an LCD, a liquid crystal layer is formed between the TFT substrate and the color filter substrate and the electric charges between the pixel electrode 800 and the common electrode changes a direction of liquid crystal molecules in the liquid crystal layer.

The gate driving circuit 13 sequentially drives the gate lines 300. The data driving circuit 15 supplies a data signal to the data lines 500 whenever the gate lines 300 are driven. The gate driving circuit 13 and the data driving circuit 15 may be substantially simultaneously formed when the effective display region 17 is formed.

The TFT substrate 10 may be used in display devices such as, but not limited to, an OLED as well as an LCD.

Referring to FIGS. 2 and 3, a pixel region formed within the effective display region 17 includes the TFT 170 connected to the gate line 300 and the data line 500, the pixel electrode 800 connected to the TFT 170, and a storage capacitor Cst. While the TFT 170 may be formed of a single metal oxide semiconductor ("MOS"), such as an N-channel metal oxide semiconductor ("NMOS") or a P-channel metal oxide semiconductor ("PMOS"), or of a complementary metal oxide semiconductor ("CMOS"), a description will be made of only a PMOS.

The TFTs 170 supply a data signal of the data line 500 to the pixel electrode 800 in response to a gate signal of the gate line 300. The TFT 170 includes first and second gate electrodes 311 and 312 connected to the gate line 300, a source electrode 510 connected to the data line 500, a drain electrode 520 connected to the pixel electrode 800, and an active layer 100 for forming a channel between the source electrode 510 and the drain electrode 520.

The first and second gate electrodes 311 and 312 protrude vertically from the gate line 300 and operate the TFT 170 according to the gate signal received from the gate line 300. As illustrated, the gate line 300 extends generally transversely across a surface of the TFT substrate 10, and the first and second gate electrodes 311 and 312 protrude perpendicularly from the gate line 300 and across the surface of the TFT substrate 10. In this case, it is desirable to form two gate electrodes, such as the first and second gate electrodes 311 and 312, in order to suppress a kink phenomenon, that is, a sudden increase in a drain current at a high drain voltage. Instead, only one gate electrode may be formed if the kink phenomenon can be suppressed by one gate electrode. Alternatively, another gate electrode may be added if the kink phenomenon still can not be suppressed by the first and second gate electrodes 311 and 312.

The source electrode 510 protrudes vertically from the data line 500 and supplies the data signal received from the data line 500 to the drain electrode 520 via the active layer 100. As illustrated in FIG. 2, the data line 500 extends in a direction substantially perpendicular to the gate line 300, and the source electrode 510 protrudes from the data line 500 in a direction substantially parallel to the gate line 300.

The drain electrode 520 faces the source electrode 510 and supplies a received data voltage to the pixel electrode 800. As further shown in FIG. 2, the first and second gate electrodes 311 and 312 are disposed between the drain electrode 520 and the source electrode 510.

The active layer 100 is formed on a buffer insulating layer 50 which is disposed between the active layer 100 and an insulating substrate 30. The active layer 100 includes a pair of channel regions 110 overlapped by and aligned with the first and second gate electrodes 311 and 312, first to fourth lightly doped drain ("LDD") regions 121, 122, 123, and 124 which contact both sides of each of the channel regions 110, and an active connection region 150 formed between the second and third LDD regions 122 and 123. The insulating layer 200 is disposed between the first and second gate electrodes 311 and 312 and the channel regions 110. The insulating layer 200 may also overlie the exposed portions of the buffer insulating layer 50.

The channel regions 110 form a channel of the TFT 170. The first to fourth LDD regions 121, 122, 123 and 124 have p-impurities injected thereinto and decrease an off current. It should be understood that an impurity is a substance that is incorporated into a semiconductor material and provides free electrons (N-type impurity) or holes (P-type impurity). The active connection region 150 connects the channel regions 110 separated from each other. In this case, the active connection region 150 may be removed by adjusting intervals between the first and second gate electrodes 311 and 312 or by forming the second and third LDD regions 122 and 123 as a single region.

The active layer 100 further includes a source contact region 130 and a drain contact region 140 into which p+ impurities are injected. The source and drain contact regions 130 and 140 are respectively connected to the source and drain electrodes 510 and 520 through first and second contact holes 751 and 752 penetrating an interlayer insulating layer 400 and the gate insulating layer 200. The pixel electrode 800 is formed on an organic protective layer 700. The pixel electrode 800 is connected to the drain electrode 520 through a third contact hole 753 penetrating the organic protective layer 700 and an inorganic protective layer 600, receiving a pixel voltage.

The storage capacitor Cst is formed such that a storage electrode 920 protruding vertically from a storage line 910, which is made of the same material and formed on the same plane as the gate line 300, is overlapped with the pixel electrode 800. As illustrated in FIG. 2, the storage line 910 extends substantially parallel to the gate line 300, and the storage electrode 920 extends substantially perpendicular to the storage line 910. The organic protective layer 700 and the interlayer insulating layer 400 are interposed between the storage electrode 920 and the pixel electrode 800. Alternatively, the storage line 910 and the storage electrode 920 may be made of the same material and formed on the same plane as the data line 500. In such an alternative embodiment, the storage electrode 920 would be separated from the pixel electrode 800 by the organic protective layer 700, but not the interlayer insulating layer 400.

As shown in FIG. 4, measured values of charge characteristics of the storage capacitor Cst, formed by and between the storage electrode 920 and the pixel electrode 800, range from 3.95E-12F to 4E-12F. When considering the fact that measurement error and measured values are very small, there is not a significant difference between the measured values and conventional normal values ranging from 3.8E-12F to 3.9E-12F.

The pixel region formed within the effective display region 17 further includes the inorganic protective layer 600 and the organic protective layer 700 in order to insulate a data pattern including the data line 500, the source electrode 510, and the drain electrode 520 from a transparent conductive pattern including the pixel electrode 800.

The inorganic protective layer 600 is formed only on the data pattern with a similar pattern to the data pattern and formed between the data pattern and the organic protective layer 700. That is, the inorganic protective layer 600 is limited in location to locations overlying the data pattern. The lower part of the inorganic protective layer 600 is in contact with the upper part of the data pattern throughout substantially the whole region of the data pattern except for a region where the drain electrode 520 is in contact with the pixel electrode 800 through the third contact hole 753. By this inorganic protective layer 600, the organic protective layer 700 is not in direct contact with the upper part of the data pattern. Meanwhile, it is possible to slightly expose the upper part of the data pattern by partially removing both sides of the lower part of the inorganic protective layer 600, such that the data pattern may have a slightly larger with than the inorganic protective layer. In other words, the data pattern may have a slightly larger perimeter than the inorganic protective layer 600.

The organic protective layer 700 is formed between the inorganic protective layer 600 and the pixel electrode 800. The upper part of the organic protective layer 700 may be formed having a flat surface or an embossing pattern.

Figure 5A:
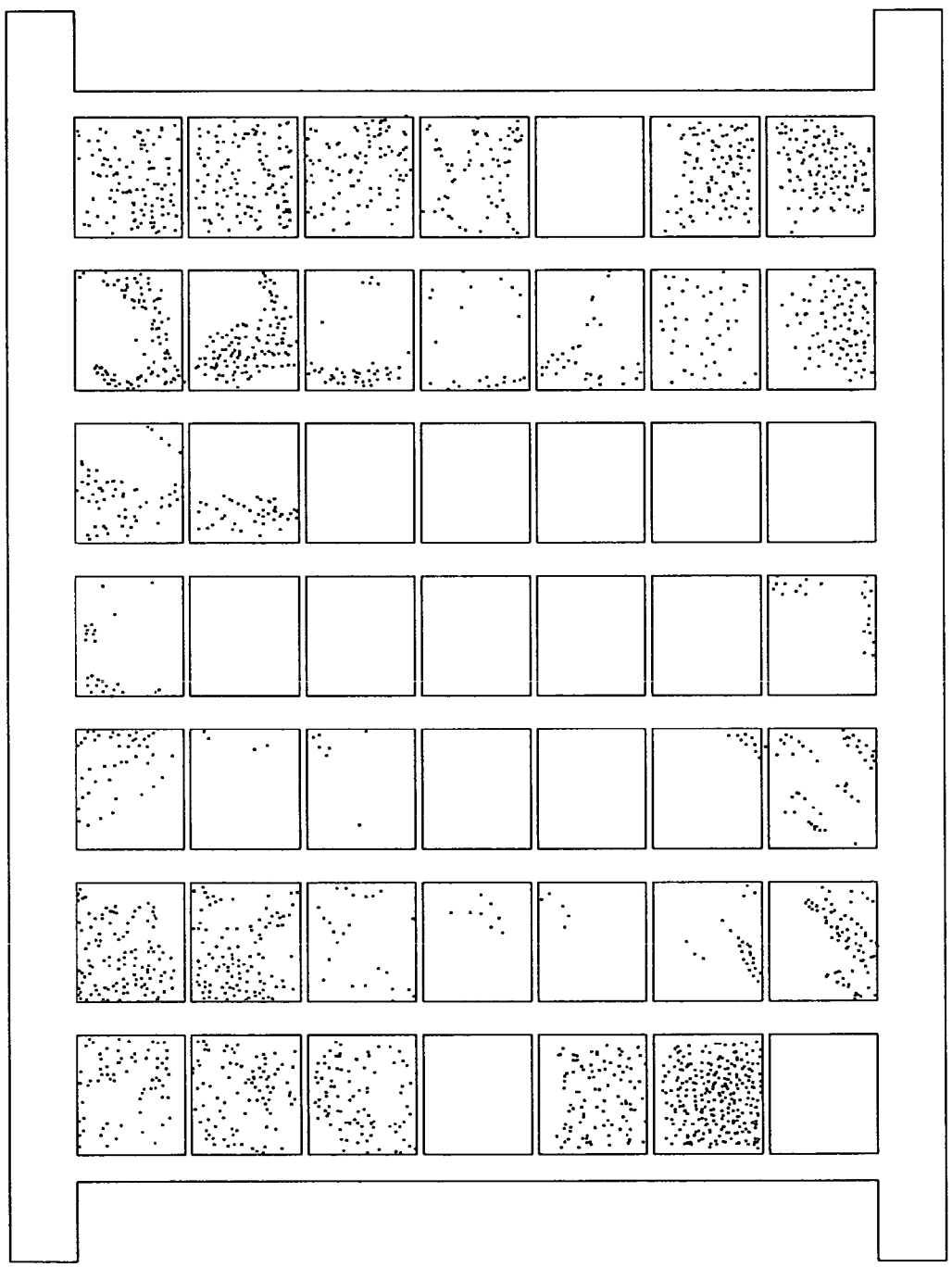
FIG. 5A is a mapping diagram illustrating high pixel defects generated from a conventional TFT substrate.
Figure 5B:
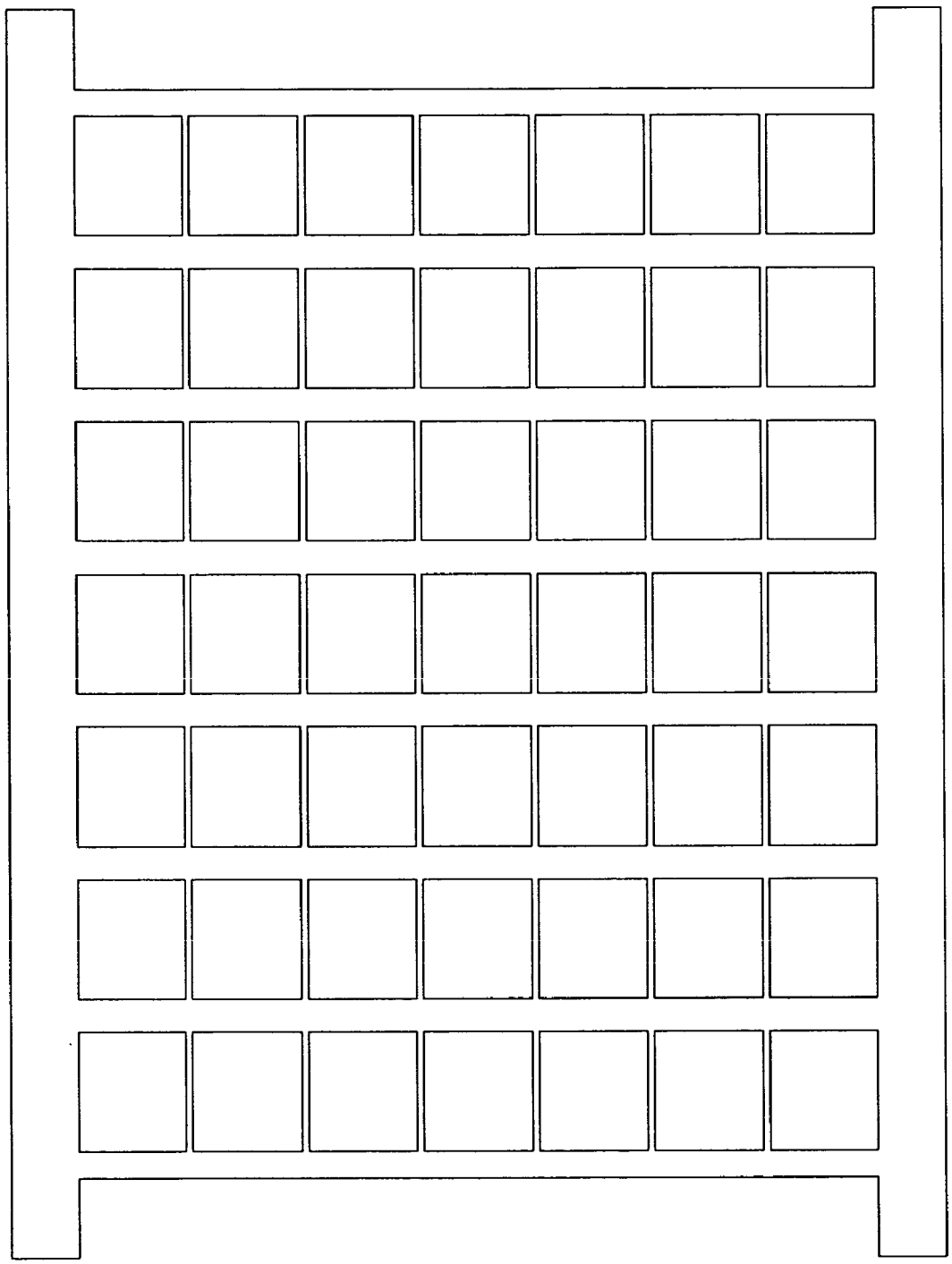
FIG. 5B is a mapping diagram illustrating high pixel defects generated from an exemplary embodiment of a TFT substrate according to the present invention.
Figure 6:
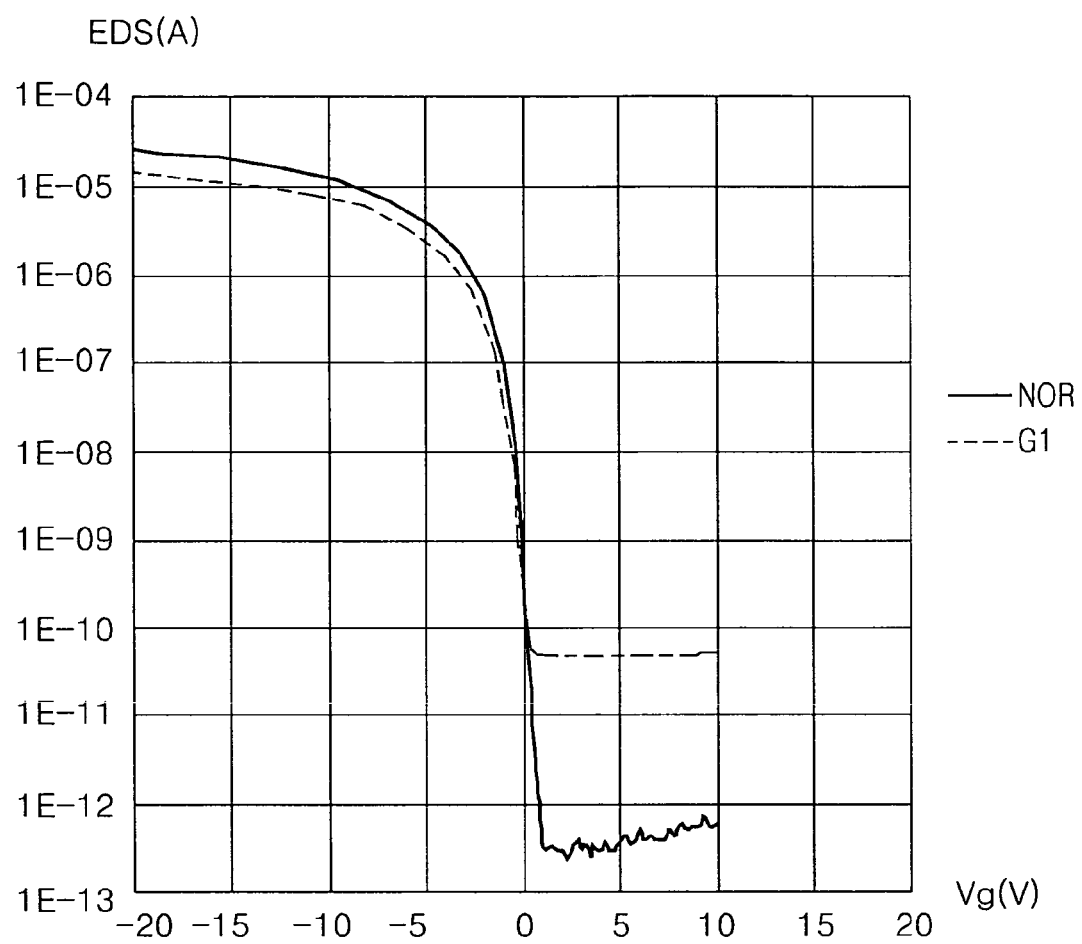
FIG. 6 is a graph illustrating a result of EDS measurement of high pixel defects generated from a conventional TFT substrate.
Figure 7:
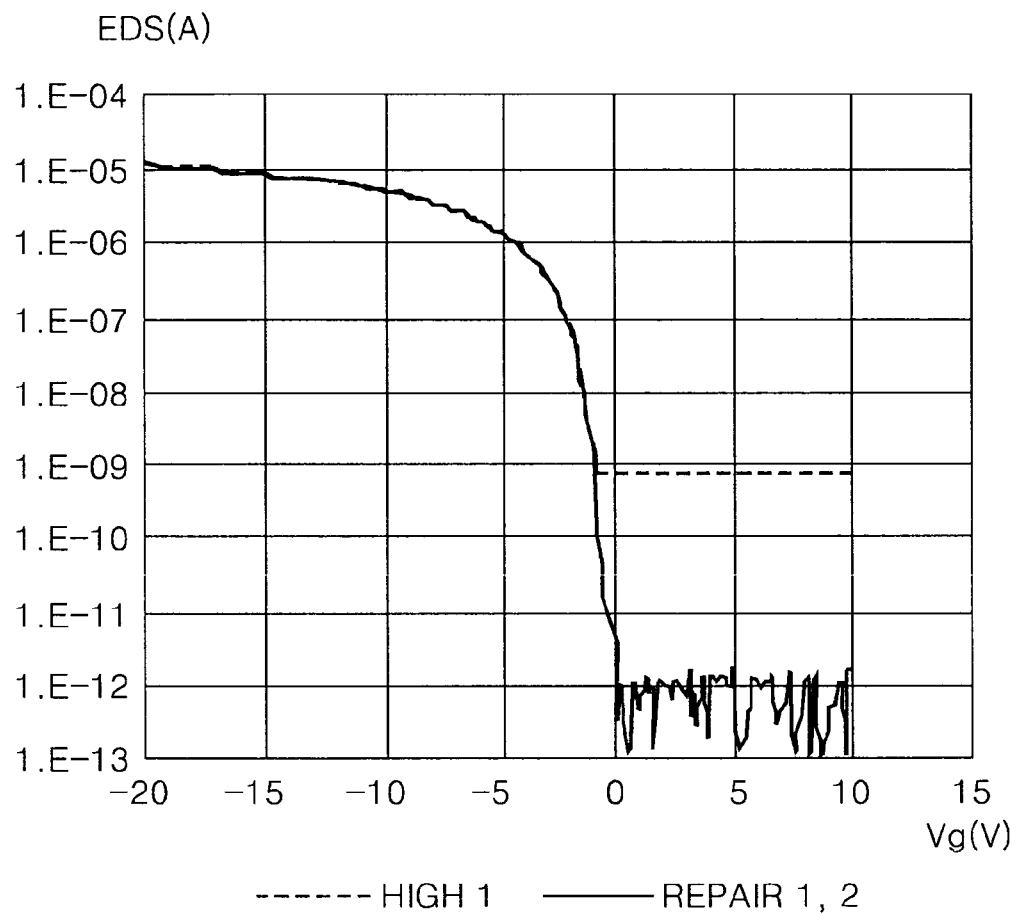
FIG. 7 is a graph illustrating a result of EDS measurement after high pixel defects generated from a conventional TFT substrate are repaired.
Figure 8:
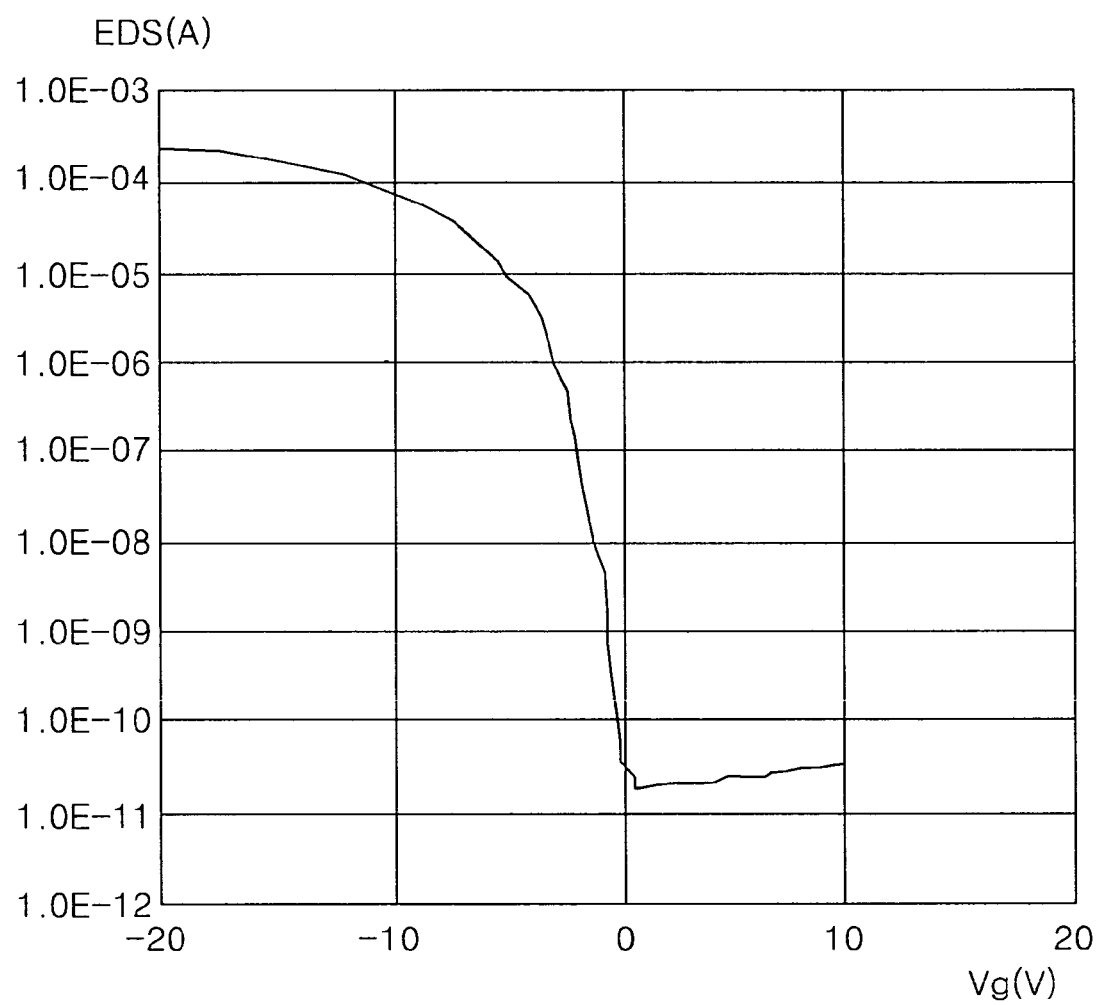
FIG. 8 is a graph illustrating a result of EDS measurement of an exemplary embodiment of a TFT substrate according to the present invention.

FIG. 5A is a mapping diagram illustrating high pixel defects generated from a conventional TFT substrate; FIG. 5B is a mapping diagram illustrating high pixel defects generated from an exemplary embodiment of a TFT substrate according to the present invention; FIG. 6 is a graph illustrating a result of Energy Dispersive Spectroscopy ("EDS") measurement of high pixel defects generated from a conventional TFT substrate; FIG. 7 is a graph illustrating a result of EDS measurement after high pixel defects generated from a conventional TFT substrate are repaired; and FIG. 8 is a graph illustrating a result of EDS measurement of an exemplary embodiment of a TFT substrate according to the present invention.

Referring to FIG. 5A, high pixel defects are generated from a conventional TFT substrate. High pixel defects mean that the data line 500 and the source electrode 510 are shorted in region A shown in FIG. 2 and thus the characteristics of the TFT substrate deteriorate. Additionally, these high pixel defects may be generated from regions other than region A.

Referring to FIG. 6, there are shown EDS measured value G1 of high pixel defects. That is, the measured value of the high pixel defects have drain current values higher than an EDS measured value NOR of a normal region by 1E-2A to 1E-3A at a gate off voltage. The measured value of the high pixel defects ranges from 1E-11A to 1E-9A. Therefore, an off current increases and the characteristics of the TFT 170 deteriorate. As shown in FIG. 7, an EDS value High1 measured after the high pixel defect region is repaired by laser has normal values Repair1 and Repair2. Thus, it can be noted that the data line 500 and the source electrode 510 are shorted.

If the TFT substrate is exposed for seven hours or more after the data pattern is formed, a metal oxide layer is formed. This metal oxide layer reacts to deionized water or moisture in the air during spin cleaning and makes the separated data line 500 and source electrode 510 be shorted, generating high pixel defects. These high pixel defects occur more in an outer region than in the center of a mother glass, as shown in FIG. 5A, due to the metal oxide layer caused by the spin cleaning.

As indicated in FIG. 5B, the exemplary embodiments of the TFT substrate according to the present invention does not show any high pixel defects even though spin cleaning is performed. This is because the data pattern is not exposed to deionized water or moisture in the air, because the data pattern is protected by the inorganic protective layer 600 formed only on the data pattern.

The exemplary embodiment of the TFT substrate according to the present invention has normal values of EDS measurement as shown in FIG. 8. In particular, a difference between drain currents caused by a difference between gate on and off voltages is maintained at a normal value of about $10^7$. This value is the same as the difference 107 in drain current which is a normal value NOR in a conventional structure shown in FIG. 6.

FIG. 9 is a graph illustrating measured values of a contact resistance of an exemplary embodiment of a TFT substrate according to the present invention as compared with a TFT substrate having conventional normal values.

Referring to FIG. 9, contact resistance values between metals in an exemplary embodiment of the TFT substrate according to the present invention range from 600,000Ω to 800,000Ω. These values are less than conventional contact resistance values ranging from 800,000Ω to 1,100,000Ω. Therefore, it is demonstrated that the TFT substrate according to the present invention has better contact resistance characteristics than a conventional TFT substrate.

As described previously, the TFT substrate according to the present invention does not form a metal oxide layer and thereby can suppress undesirable traits such as an unfastened inorganic layer, high pixel defects, stains, a disconnected data pattern, etc. Furthermore, since a minute pattern can be formed, it is possible to achieve an SOG structure.

A process of manufacturing the TFT substrate will now be described with reference to FIGS. 10A to 10F.

Referring to FIG. 1A, a buffer insulating layer 50 is formed on an insulating substrate 30, and an active layer 100 is formed on the insulating substrate 30 by a first mask process.

More particularly, an inorganic insulating material such as silicon nitride SiNx or silicon dioxide $SiO_2$ is deposited on the whole surface of the insulating substrate 30 to prevent impurities of the insulating substrate 30 from diffusing. This inorganic insulating material may form the buffer insulating layer 50.

An amorphous silicon a-Si layer is formed on the buffer insulating layer 50 by low pressure chemical vapor deposition ("LPCVD") or plasma enhanced chemical vapor deposition ("PECVD") and crystallized to form the active layer 100. In this case, a dehydrogenation process for eliminating hydrogen existing in the a-Si layer may be conducted before crystallization.

To crystallize the a-Si layer, a sequential lateral solidification ("SLS") method, which is one of an eximer laser annealing ("ELA") method, may be used for improving the size of a crystal by scanning a line beam in the horizontal direction to laterally grow the crystal. Alternatively, a general ELA method or other crystallization methods may be used.

Referring to FIG. 10B, a gate insulating layer 200 is formed on the buffer insulating layer 50 and the active layer 100. A gate pattern, including a gate line 300, and first and second gate electrodes 311 and 312, and a storage line 910 and a storage electrode 920 are formed on the gate insulating layer 200 by a second mask process. Impurities are doped into a source contact region 130, a drain contact region 140, and an active connection region 150. Other impurities are doped into the first through fourth LDD regions 121, 122, 123, and 124.

More particularly, an inorganic insulating material such as SiNx or $SiO_2$ is deposited on the whole surface of the buffer insulating layer 50 and the active layer 100 to form the gate insulating layer 200.

Then, a gate metal layer, such as, but not limited to, chromium Cr, Cr alloy, molybdenum Mo, Mo alloy, silver Ag, Ag alloy, tungsten W, W alloy, titanium Ti, or Ti alloy, is deposited with a single layered or multi-layered structure by a sputtering technique on the gate insulating layer 200. By example only, a single layer made of an aluminum Al alloy of aluminum neodymium AlNd or double layers made of Al and AlNd may be deposited.

Next, a photoresist is coated on the gate metal layer and the gate metal layer is patterned by a photolithographic process by using a second mask. Photolithography is a process used to transfer a pattern from an optic mask to the layer of resist deposited on the surface. The optic mask blocks resist exposure to UV radiation in selected areas and includes chrome opaque areas supported by a plate transparent to UV radiation. Then a single layered or multi-layered gate pattern is formed.

Then p+ impurities are doped into the source contact region 130, the drain contact region 140, and the active connection region 150 by using the photoresist remaining only on the gate pattern as a mask.

The photoresist remaining only on the gate pattern is removed and p-impurities are doped into the first to fourth LDD regions 121, 122, 123, and 124.

An activation process is conducted so that the p+ impurities can diffuse in the source contact region 130, the drain contact region 140, and the active connection region 150 and the p– impurities can diffuse in the first to fourth LDD regions 121, 122, 123, and 124. For activation, a rapid thermal annealing ("RTA") technique for heating a corresponding region for a short time by using a focused lamp is used, or other activation techniques may instead be used.

Referring to FIG. 10C, an interlayer insulating layer 400 is formed on the gate insulating layer 200 and the gate pattern and the storage line 910 and the storage electrode 920 by using a third mask process.

In more detail, the interlayer insulating layer 400 of a single layered or multi-layered structure is deposited on the gate insulating layer 200 and the gate pattern by using an inorganic insulating material such as SiNx or $SiO_2$ by a PECVD or atmospheric pressure chemical vapor deposition ("APCVD") process.

Next, first and second contact holes 751 and 752 penetrating the interlayer insulating layer 400 and the gate insulating layer 200 are formed by a photolithographic process using a third mask, exposing the source contact region 130 and the drain contact region 140, respectively.

Figure 10A:
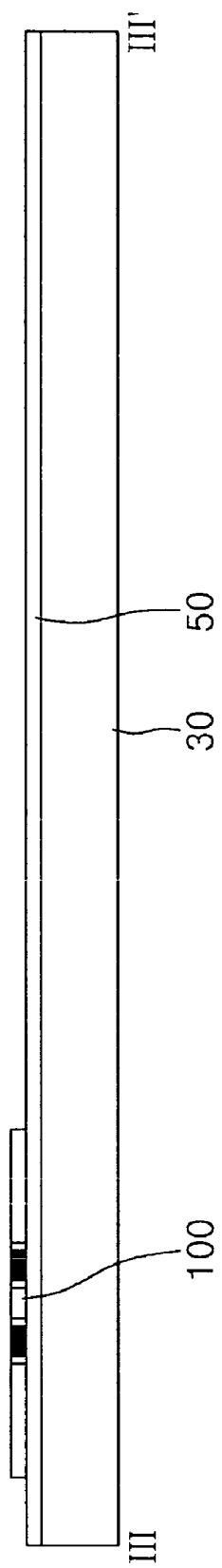
Figure 10D:
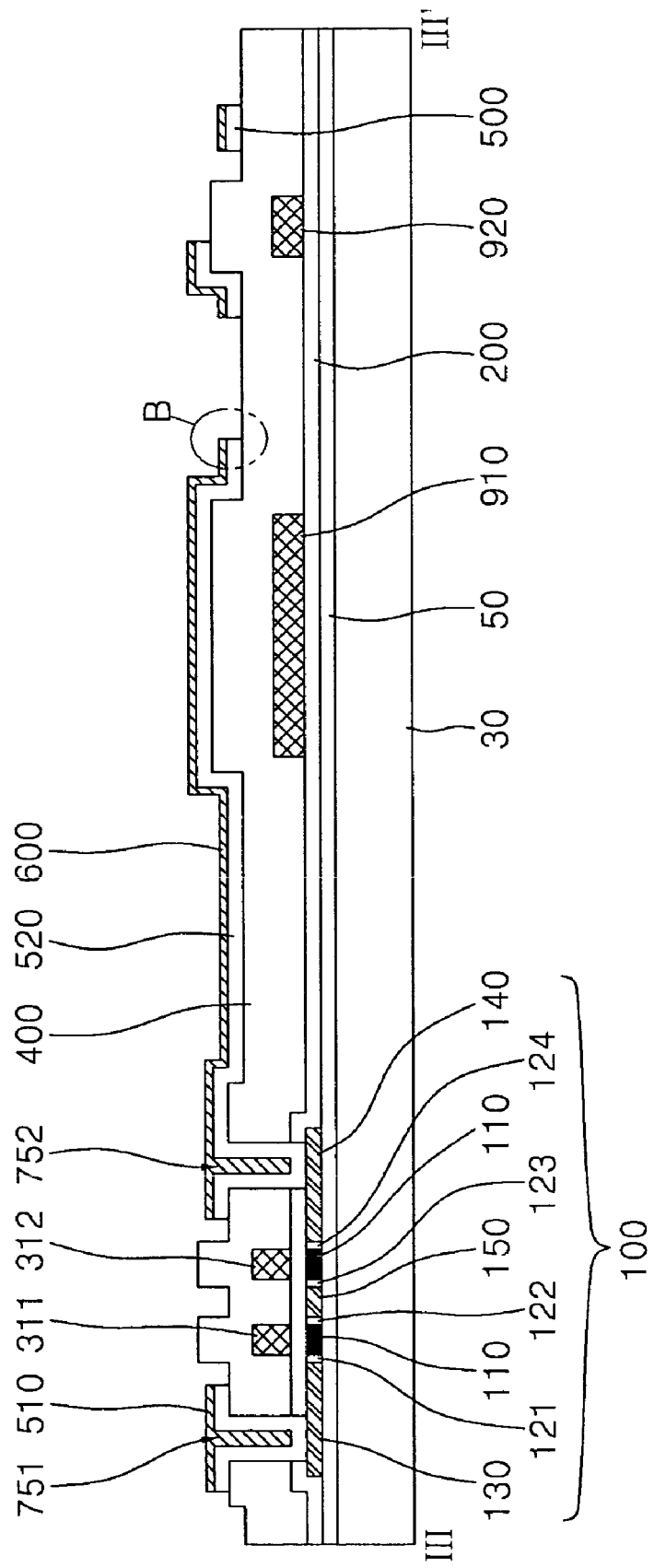

Referring to FIG. 10D, a data pattern including the data line 500, the source electrode 510 and the drain electrode 520, and an inorganic protective layer 600 are formed.

In more detail, a data metal layer, such as Cr, Cr alloy, Mo, Mo alloy, Ag, Ag alloy, W, W alloy, Ti, or Ti alloy, is deposited with a single layer or multi-layered structure by a sputtering method. By example only, a single layer of MoW, triple layers of Ti/Al/Ti, or triple layers of Mo/Al/Mo may be deposited.

Next, an inorganic insulating material such as SiNx or $SiO_2$ is deposited on the whole surface of the data metal layer to form a single layered or multi-layered inorganic protective layer. In this case, it is desirable not to expose the data metal layer to the air or moisture in the air. For instance, the data metal layer and the inorganic protective layer can be sequentially deposited within the same chamber.

Thereafter, annealing is conducted in order to recover the characteristics of the channel region 110 weakened due to the deposition process and to improve contact resistances between metals. An RTA technique may be used for the annealing, but other activation techniques may alternatively be used.

Next, a photoresist having positive photosensitivity is coated on the inorganic protective layer and the photoresist is exposed to light by using a fourth mask. The photoresist is patterned so that the photoresist remains only on the data pattern and the inorganic protective layer, forming a patterning mask of the photoresist.

A dry photolithographic process is conducted by using the patterning mask of the photoresist, completing the inorganic protective layer 600 and the data pattern including the data line 500, source electrode 510, and drain electrode 520.

That is, a first etching process is implemented by using sulfur hexafluoride $SF_6$ and oxygen $O_2$ to etch the data metal layer except for a part thereof. In this case, the inorganic protective layer is formed. It is desirable to use a dry etching gas of which etching selectivity is similar with respect to the inorganic protective layer 600 and the data pattern.

Next, a second etching process is conducted by using chlorine $Cl_2$ and oxygen $O_2$ to etch the partially remaining data metal layer, forming the data pattern. It is desirable to use a dry etching gas having good etching performance to the data pattern and poor etching performance to the interlayer insulating layer 400. The $Cl_2$ and $O_2$ have etching selectivity of about 20:1 to the data pattern and the interlayer insulating layer 400.

In this case, it is possible to further etch both sides of the inorganic protective layer 600 to expose a part of both sides of the upper part of the data pattern by controlling gas flow, process time, temperature, DC power, etc. Thus, the inorganic protective layer 600 would have slightly smaller dimensions than the data pattern. Further, the interlayer insulating layer 400 may be further etched so that the interlayer insulating layer 400 does not make contact with the data pattern at a part of both sides of the lower part of the data pattern. Moreover, the inorganic protective layer 600 and the data pattern may be formed by a single etching process.

Next, the patterning mask of the photoresist is removed by a strip process.

It can be appreciated that the inorganic protective layer 600 is formed only on the data pattern by the above-described processes. This is for eliminating various defects which may occur in a conventional structure as previously described.

Figure 10E:
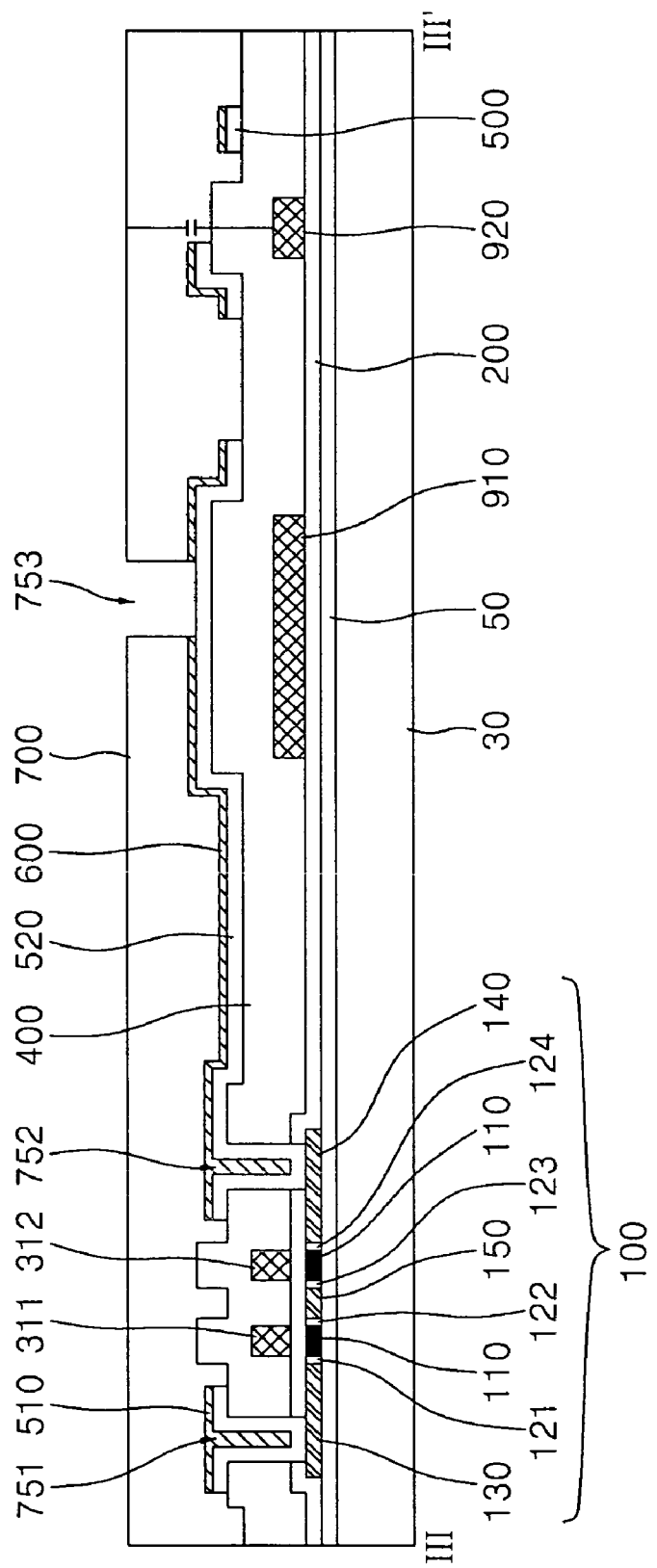

Referring to FIG. 10E, an organic protective layer 700 is formed on the inorganic protective layer 600 and the interlayer insulating layer 400 by a fifth mask process.

More particularly, the organic protective layer 700 is deposited on the inorganic protective layer 600 and the interlayer insulating layer 400 by a spin coating technique. A photosensitive organic material such as, but not limited to, acryl is used as the organic protective layer 700. A third contact hole 753 and the organic protective layer 700 are formed by a photolithographic process using a fifth mask. Alternatively, the surface of the organic protective layer 700 may be formed to have an embossing pattern by using a partial exposure mask as the fifth mask. In this case, the partial exposure mask is a half-tone mask or a diffraction exposure mask.

Figure 10F:
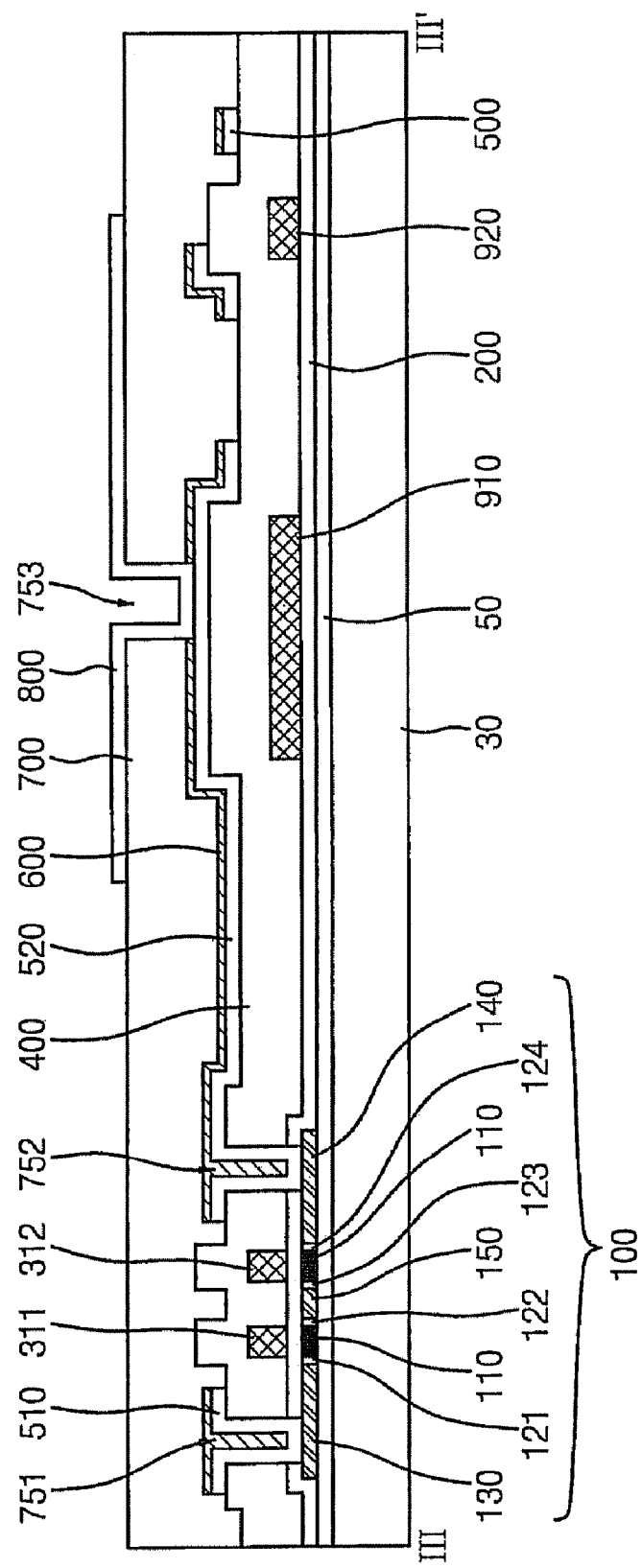

Referring to FIG. 10F, a transparent conductive pattern including the pixel electrode 800 is formed on the organic protective layer 700 by a sixth mask process. In more detail, a transparent conductive metal layer such as Indium-Tin-Oxide ("ITO") or Indium-Zinc-Oxide ("IZO") is deposited on the organic protective layer 700. Thereafter, a transparent conductive pattern is formed by patterning the transparent conductive metal layer by a photolithographic process using the sixth mask, forming the pixel electrode 800 in the vicinity of the third contact hole 753 such that the pixel electrode 800 is in contact with the drain electrode 520.

As described above, the TFT substrate according to the present invention includes the inorganic protective layer formed only on the data pattern.

Such a structure can suppress stains because the data pattern is not directly exposed to various chemicals. Moreover, since a metal oxide layer is not formed, problems of an unfastened organic protective layer, disconnected data pattern, shorted data line and source electrode, etc. can be solved. Therefore, the display quality of a display device such as an LCD or an OLED which uses a TFT substrate can be improved. Further, since a minute pattern can be formed, the TFT substrate is applicable to an SOG structure.

While the invention has been shown and described with reference to a certain preferred embodiment thereof, it will be understood by those skilled in the art that various changes in form and details may be made therein without departing from the spirit and scope of the invention as defined by the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A thin film transistor substrate, comprising:
    an insulating substrate;
    a gate pattern formed on the insulating substrate, the gate pattern comprising a gate line and a gate electrode;
    a gate insulating layer covering the gate pattern;
    an active layer formed on a portion of the gate insulating layer corresponding to the gate electrode;

a data pattern comprising a data line, a source electrode, and a drain electrode;

an inorganic protective layer formed on and in direct contact with the data pattern wherein the inorganic protective layer has substantially the same shape and discontinuous endpoints as the data pattern; and an organic protective layer formed on the inorganic protective layer.

2. The thin film transistor substrate of claim 1, wherein the inorganic protective layer comprises silicon nitride (SiNx) or silicon dioxide (SiOx).

3. The thin film transistor substrate of claim 2, wherein the inorganic protective layer has a narrower width than a width of the data pattern.

4. The thin film transistor substrate of claim 3, wherein the inorganic protective layer has a perimeter less than a perimeter of the data pattern, and a periphery of the inorganic protective layer lies within a projected periphery of the data pattern.

5. The thin film transistor substrate of claim 1, wherein the data pattern comprises chromium Cr, molybdenum Mo, silver Ag, tungsten W, titanium Ti, or Mo alloy.

6. The thin film transistor substrate of claim 1, further comprising a pixel electrode formed on the organic protective layer, wherein a contact hole is formed through the inorganic protective layer and the organic protective layer so as to expose the drain electrode and the pixel electrode is connected to the drain electrode via the contact hole.

7. The thin film transistor substrate of claim 6, further comprising a storage electrode overlapped by the pixel electrode, a storage capacitor formed by and between the storage electrode and the pixel electrode, wherein at least one of the organic protective layer and the inorganic protective layer is disposed between the storage electrode and the pixel electrode.

8. A thin film transistor substrate, comprising:
an insulating substrate;
an active layer formed on the insulating substrate;
a gate insulating layer covering the active layer;
a gate pattern formed on the gate insulating layer, the gate pattern comprising a gate line and a gate electrode;
an interlayer insulating layer covering the gate pattern;
a data pattern formed on the interlayer insulating layer, the data pattern comprising a data line, a source electrode, and a drain electrode;
an inorganic protective layer formed on and in direct contact with the data pattern wherein the inorganic protective layer has substantially the same shape and discontinuous endpoints as the data pattern;
an organic protective layer formed on the inorganic protective layer; and
a pixel electrode formed on the organic protective layer and connected to the drain electrode.

9. The thin film transistor substrate of claim 8, further comprising a buffer insulating layer formed between the semiconductor layer and the insulating substrate.

10. A method of manufacturing a thin film transistor substrate, the method comprising:
forming an active layer on an insulating substrate;
forming a gate insulating layer covering the active layer on the insulating layer;
forming a gate pattern comprising a gate line and a gate electrode on the gate insulating layer;
forming an interlayer insulating layer covering the gate pattern on the gate insulating layer;
depositing a data metal layer on the interlayer insulating layer;
forming an inorganic protective layer on the data metal layer;
patterning the data metal layer and the inorganic protective layer to form a data pattern comprising a data line, a source electrode and a drain electrode and to form an inorganic protective pattern on and directly in contact with the data pattern; wherein the inorganic protective pattern has substantially the same shape and discontinuous endpoints as the data pattern;
forming an organic protective layer on the inorganic protective pattern; and
forming a pixel electrode on the organic protective layer.

11. The method of claim 10 wherein forming the inorganic protective layer occurs without exposing the data metal layer to air.

12. The method of claim 11, wherein depositing a data metal layer and forming an inorganic protective layer are performed within the same chamber.

13. The method of claim 10, wherein forming the inorganic protective layer occurs without exposing the data metal layer to moisture.

14. The method of claim 10, wherein patterning the data metal layer comprises:
forming a photoresist on the inorganic protective layer;
forming a patterning mask by patterning the photoresist;
etching the data metal layer and the inorganic protective layer by using the patterning mask as a mask; and
removing the patterning mask.

15. The method of claim 10, wherein etching the data metal layer and the inorganic protective layer comprises:
a first dry etching of the data metal layer and the inorganic protective layer; and
a second dry etching of the data metal layer.

16. The method of claim 14, wherein the first dry etching is performed using $SF_6$ and $O_2$, and wherein the second dry etching is performed using $Cl_2$ and $O_2$.

17. The method of claim 15, wherein the inorganic protective pattern has a width less than a width of the data pattern.

18. The method of claim 17, wherein the inorganic protective pattern has a perimeter less than a perimeter of the data pattern, and a periphery of the inorganic protective pattern lies within a projected periphery of the data pattern.

19. The method of claim 10, flirt her comprising:
forming a contact hole penetrating the organic protective layer and the inorganic protective pattern.

* * * * *